(12) United States Patent
Brunner

(10) Patent No.: US 9,366,696 B2
(45) Date of Patent: Jun. 14, 2016

(54) ROLL TO ROLL TESTER AND METHOD OF TESTING FLEXIBLE SUBSTRATES ROLL TO ROLL

(75) Inventor: Matthias Brunner, Kirchheim-Heimstetten (DE)

(73) Assignee: Applied Materials, Inc., Santa Clara, CA (US)

( * ) Notice: Subject to any disclaimer, the term of this patent is extended or adjusted under 35 U.S.C. 154(b) by 95 days.

(21) Appl. No.: 14/352,043

(22) PCT Filed: Oct. 19, 2011

(86) PCT No.: PCT/EP2011/068271
§ 371 (c)(1),
(2), (4) Date: Apr. 30, 2014

(87) PCT Pub. No.: WO2013/056735
PCT Pub. Date: Apr. 25, 2013

(65) Prior Publication Data
US 2014/0253160 A1    Sep. 11, 2014

(51) Int. Cl.
*G01R 31/20*    (2006.01)
*G01R 1/02*    (2006.01)
*G09G 3/00*    (2006.01)
*G01R 31/01*    (2006.01)

(52) U.S. Cl.
CPC    *G01R 1/02* (2013.01); *G09G 3/006* (2013.01); *G01R 31/01* (2013.01)

(58) Field of Classification Search
CPC ........... G01R 31/2887; G01R 31/2831; G01R 31/302; G01R 31/308; G01R 1/71
See application file for complete search history.

(56) References Cited

U.S. PATENT DOCUMENTS

| | | | |
|---|---|---|---|
| 4,575,676 A * | 3/1986 | Palkuti | G01R 31/302 324/750.19 |
| 5,461,324 A | 10/1995 | Boyette et al. | |
| 5,631,571 A * | 5/1997 | Spaziani | G01R 1/071 324/658 |
| 6,034,524 A * | 3/2000 | Barringer | G01R 31/2887 324/750.22 |
| 6,549,022 B1 * | 4/2003 | Cole, Jr. | G01R 31/308 324/754.23 |
| 7,368,925 B2 * | 5/2008 | Navratil | G01R 31/2831 324/750.27 |
| 2002/0132383 A1 | 9/2002 | Hiroki et al. | |
| 2011/0141137 A1 | 6/2011 | Nagai | |

OTHER PUBLICATIONS

International Search Report and Written Opinion dated Jan. 24, 2012 for PCT/EP2011/068271.

* cited by examiner

*Primary Examiner* — Minh N Tang
(74) *Attorney, Agent, or Firm* — Patterson & Sheridan, LLP

(57) ABSTRACT

An apparatus for testing of a plurality of electronic devices on a flexible substrate is described. The apparatus includes at least two rollers configured for guiding the flexible substrate into a testing area along transport direction, at least one prober configured for electrically contacting one or more of the electronic devices, at least one probing support configured for supporting a portion of the flexible substrate during electrical contact with the at least one prober, and a test device for functional testing of one or more of the electronic devices.

18 Claims, 6 Drawing Sheets

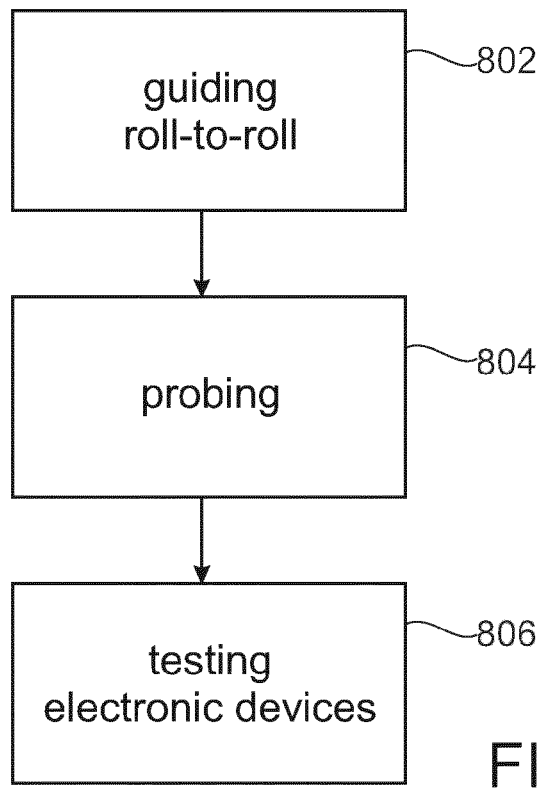
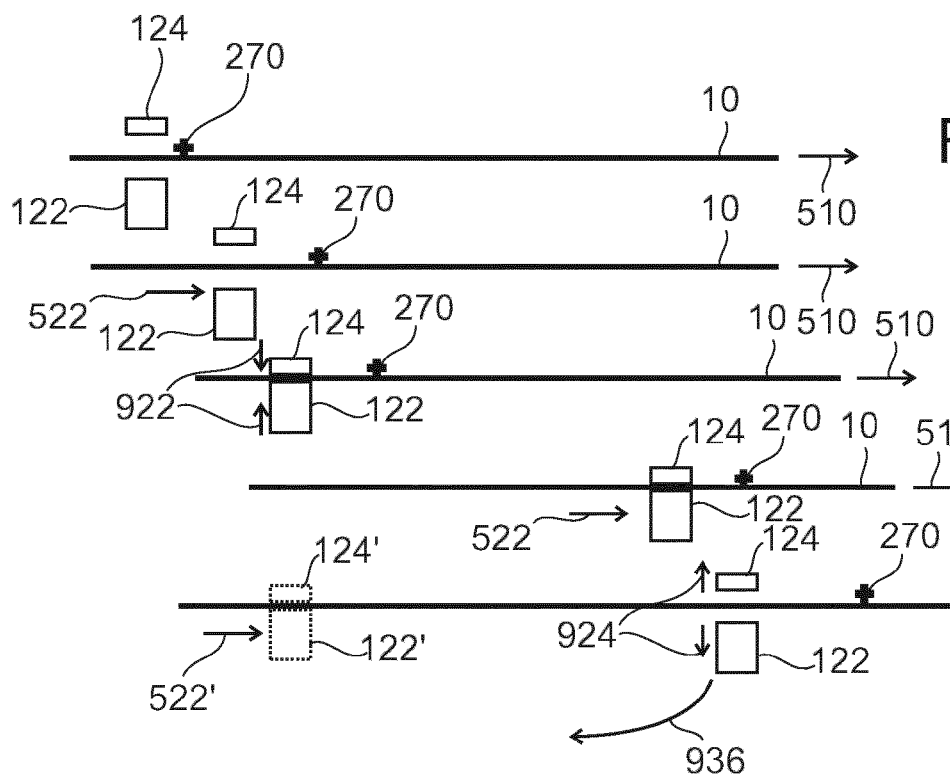

ROLL TO ROLL TESTER AND METHOD OF TESTING FLEXIBLE SUBSTRATES ROLL TO ROLL

TECHNICAL FIELD OF THE INVENTION

Embodiments of the present invention relate to testing of electronic devices on flexible substrates, such as transistors of a display manufactured on a flexible substrate. Embodiments of the present invention particularly relate to testing and testing apparatuses in roll-to-roll devices, and specifically to an apparatus for testing of a plurality of electronic devices on a flexible substrate and to a method of testing of a plurality of electronic devices on a flexible substrate.

BACKGROUND OF THE INVENTION

A current trend is the manufacturing of an increasing number of electronic and optoelectronic devices, such as printed circuit boards, displays and/or solar cells, on flexible substrates. Thereby, the use of cheap substrates intends to make the devices cheaper. Accordingly, there is an increasing need for and an increasing development of roll-to-roll thin film deposition apparatuses. Thus, there is a desire for platform concepts that permit low cost deposition and/or processing for different substrate materials and different stacks of thin film layers.

Further, there is an increasing demand for display elements without picture tubes. The standards for liquid crystal displays (LCD) and other display elements, in which control elements, for example thin film transistors (TFT), are used, increase. These display elements have pixels arranged in a matrix, wherein the pixels each provide an electronic device that is to be functional. Yet, also in other fields an increasing amount of elements have to be tested. This can be, for example, microelectronic and/or micromechanical elements. These elements are for example thin film transistors, connection networks of a chip, transistors, electron emitters of an emitter array, the electrodes for pixels of a display, micromechanical mirrors of an array and other elements, which distinguish themselves in particular by being present as a plurality of elements (100.000 a to several 1.000.000), whereby each element is electrically controllable.

For thin film deposition systems in the field of manufacturing electronic devices, e.g. consumer electronic devices, the testing of the electronic devices on the substrate is a task that is typically to be conducted. In order to obtain, for example, a good image quality of a display element, only a few of the several million pixels are allowed to be defective. For guaranteeing a cost efficient production it is therefore important, most notably for the display elements continuously increasing in size, to provide high-capacity in situ test methods.

Typically, flat panel displays are made of glass. These can be LCD, OLED and other flat panel displays. Yet, there are a small number of flexible displays, which are manufactured, but the process primarily is using flat glass substrate as a carrier for a flexible substrate. A more cost effective manufacturing of flexible displays is expected when the process can be done from roll to roll. For example, layers can be deposited and patterned to make a transistor array on a flexible substrate while the substrate moves from one roll to another other roll. There are also concepts to print the transistor array on the substrate. In order to beneficially reduce the costs for electronic and/or optoelectronic devices, such as displays, capacitors, solar, printed circuit boards or the like roll-to-roll processes, a testing system for electronic devices on a flexible substrate is desired.

SUMMARY OF THE INVENTION

In light of the above, an apparatus for the testing of a plurality of electronic devices on a flexible substrate according to independent claim 1 and a method of testing of a plurality of electronic devices on a flexible substrate according to independent claim 12 are provided. Further aspects, advantages, and features of the present invention are apparent from the dependent claims, the description, and the accompanying drawings.

According to one embodiment, an apparatus for testing of a plurality of electronic devices on a flexible substrate is provided. The apparatus includes at least one roller configured for guiding the flexible substrate in a testing area along a transport direction, at least one prober configured for electrically contacting one or more of the electronic devices, at least one probing support configured for supporting a portion of the flexible substrate during electrically contacting with the at least one prober, and a test device for functional testing of one or more of the electronic devices.

According to another embodiment, a substrate processing system for processing and testing a flexible substrate is provided. The system includes at least one substrate processing chamber for manufacturing a plurality of electronic devices on the flexible substrate and an apparatus for testing a plurality of electronic devices on a flexible substrate. The apparatus for testing includes at least two rollers configured for guiding the flexible substrate into a testing area and out of testing area along a transport direction, at least one prober configured for electrically contacting one or more of the electronic devices, at least one probing support configured for supporting a portion of the flexible substrate during electrically contacting with the at least one prober, and a test device for functional testing of one or more of the electronic devices.

According to a further embodiment, a method of testing of a plurality of electronic devices on a flexible substrate is provided. The method includes guiding the flexible substrate from on roll into a testing area and out of the testing area onto a further roll along a transport direction, supporting a first side of the flexible substrate, probing one or more of the electronic devices from a second side of the flexible substrate, wherein the second side opposes the first side, and testing the electrical functioning of the one or more of the electronic devices.

According to one embodiment, an apparatus for testing of a plurality of electronic devices on a flexible substrate is provided. The apparatus includes at least one roller configured for guiding the flexible substrate in a testing area along a transport direction, at least one prober configured for electrically contacting one or more of the electronic devices, at least one probing support configured for supporting a portion of the flexible substrate during electrically contacting with the at least one prober, and a test device for functional testing of one or more of the electronic devices, wherein the at least one prober is configured to stay in contact with contact pads on the flexible substrate while the flexible substrate is moving.

Embodiments are also directed at apparatuses for carrying out the disclosed methods and include apparatus parts for performing each described method step. These method steps may be performed by way of hardware components, a computer programmed by appropriate software, by any combination of the two or in any other manner. Furthermore, embodiments according to the invention are also directed at methods by which the described apparatus operates. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following:

FIG. 8 shows a flow-chart illustrating embodiments of testing of a plurality of electronic devices on a flexible substrate according to embodiments described herein; and FIG. 9 shows a flexible substrate being contacted according to some embodiments described herein and with a prober and probing support according to embodiments described herein.

DETAILED DESCRIPTION OF EMBODIMENTS

Figure 1:
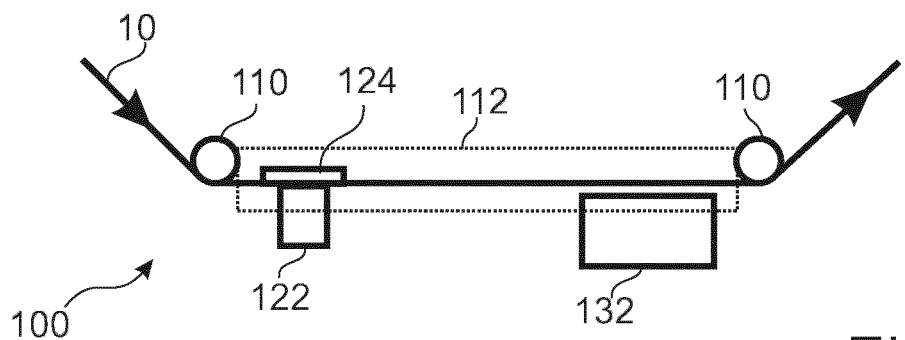
FIG. 1 shows a test apparatus for testing of electronic devices on a flexible substrate according to embodiments described herein.

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

Furthermore, in the following description, a corpuscular beam may be understood as a beam of charged particles (particle beam), such as for example an electron or ion-beam, or a laser beam. This means that the term corpuscular beam is to be understood as a laser beam, in which the corpuscles or photons, as well as a particle beam, in which the corpuscles are ions, atoms, electrons or other particles.

For the test methods of the individual picture elements, it is inter alia necessary to scan or to address the picture elements with the corpuscular beam. That is, the corpuscular beam is to be guided on individual picture elements. In case of charged particles as corpuscles, this deflection may be carried out by magnetic, electrostatic or magneto-electrostatic deflectors. In case of photons as corpuscles, the deflection may be carried out by mirrors or other suitable means. Further, it is possible to image the area to be tested with a light beam. A measurement position may not be on the pixel directly but may be on an adjacent position on a modulator close to the pixel. Addressing or testing electronic devices by scanning or deflection can be referred to as a sequential method. Alternatively, in case of photons, a parallel addressing or testing is possible by imaging the electronic devices, e.g. pixels, using a lens system.

According to embodiments described herein, which can be combined with other embodiments described herein, for the test methods and test apparatuses described herein, the individual electronic devices on one product, e.g. the pixels on a device on a flexible substrate, are tested with a corpuscular beam. The corpuscular beam can either be used for detecting charges applied via a supply line and/or applying charges on a pixel electrode.

A flexible substrate or web as used within the embodiments described herein can typically be characterized in that it is bendable or flexible. The term "web" may be synonymously used with the term "strip" or the term "flexible substrate". For instance, the flexible substrate or web as described in embodiments herein may be a foil or another synthetic substrate. For example, the web may be selected from a group of substrates consisting of steel substrates, stainless steel substrates, polymer substrates, PET substrates, PEN substrates, and polyamide substrates. According to some embodiments, which can be combined with any other embodiment described herein, the web has a thickness from 10 μm to 600 μm, more typically from 15 μm to 500 μm, such as 50 μm or 100 μm.

As shown in FIG. 1, a testing apparatus 100 is provided. The testing apparatus 100 includes at least two rollers 110 for guiding the flexible substrate 10 into a testing area 112 along a transport direction, which is indicated by the arrows. For testing of electronic devices on the substrate, an electrical contact with the electronic devices is provided. Thereby, a prober 122, such as a probe head, is electrically connected with connections on the flexible substrate 10.

According to typical embodiments, which can be combined with other embodiments described herein, the product that has been manufactured on the flexible substrate 10, such as a display, a solar cell, capacitors, or other products, includes contact pads for being contacted by the prober 122. The contact pads are electrically connected to the electronic elements of the product to be tested. For example, the contact pads of a display can be connected to a drive electronics, which provides the desired voltages for each thin-film transistor. Thereby, each pixel can be controlled electronically.

According to some embodiments, which can be combined with other embodiments described herein, the prober 122 has a plurality of needles or contact pins, wherein each needle can be individually controlled with a control voltage or a control current, in order to provide the electronic devices with the desired signals for testing and/or for operation of the electronic devices. The needles can also be described as contact pins, which can be releasably contacted with the contact pads on the substrate in order to provide and/or receive the signals to the electronic devices.

As compared to transistor arrays, which are manufactured on a glass substrate, wherein a functional test can be conducted after the manufacturing process is finished, to find defects and repair defects of individual transistors in the array, a functional test on the flexible substrate includes additional challenges. For example, the contacting of contact pads on the substrate is more complex because the substrate cannot resist contact forces in light of the substrate being flexible.

Further, particularly for test systems and test methods which are provided in an in-line system with the manufacturing of the product on the flexible substrate, testing should typically be conducted according to the substrate movement during manufacturing, for example a continuous and fast movement of the substrate from roll-to-roll. In order to be able to detect and repair defects of the electronic devices, for example wrong connections, opens, or other electrical malfunctioning occurrences, the functional testing of the electrical devices, for example in an array of electrical devices, should be conducted similarly to the manufacturing in a roll-to-roll process. Thereby, the full benefit of the reduced manufacturing costs of electronic products on flexible substrates can be utilized.

As shown in FIG. 1, the probing head or prober 122 is provided on one side of the flexible substrate 10. A probing support 124 is provided on the other side of the flexible substrate and opposing the prober. Thereby, the probing support can support the flexible substrates while contact forces are provided by the prober 122 such that a sufficiently stable electrical contact can be provided.

However, as described in more detail below, the prober or probing head and the probing support are configured for an undisturbed movement of the flexible substrate in the gap between the prober and probing support when the prober is disconnected. Further, the prober and the probing support are configured for contacting contact pads on the flexible substrate and, yet further, according to some embodiments, the probing can be adapted for following a transport direction of the flexible substrate. Thereby, an undisturbed transport of the flexible substrate typically avoids contact of the moving substrate with the probing head and/or the probing support in order to not damage the flexible substrates, layers deposited thereon, or the electronic devices manufactured on the flexible substrate. According to some implementations, which can be combined with embodiments described herein, the probing support can be a roller or even one of the rollers 110 shown in FIG. 1. Accordingly, a damage-free probing support can also be provided without mechanically disconnecting the probing support from the substrate, e.g. without a probing support being configured to move away from the substrate.

Further, a test device 132 is provided in the test area 112. The test device 132 is configured for the functional testing of one or more of the electronic devices on the flexible substrate 10. Thereby, for example, if a display on the flexible substrate is tested, each thin-film transistor or each pixel of the display can be tested by the test device 132. Typically, the test device conducts a test utilizing the prober 122. For example, the test device tests a voltage or potential provided on each pixel electrode and thereby tests the function of the electronic devices within the display, or the like.

According to some embodiments, which can be combined with other embodiments described herein functional testing is understood as a test of the electrical function of the electronic device. Thereby, typically, a plurality of electronic devices are tested on the flexible substrate. For example, thousands or millions of pixel elements of the display can each be tested for proper electrical connection with the test device.

According to different embodiments, which can be combined with other embodiments described herein, the testing device can be an electron beam test device. Thereby, an electron beam is directed onto a plurality of electrical devices of the manufactured product on the flexible substrate. The charging of the area or the element can be achieved by the electron beam. This charging can be controlled and/or compared to an expected charging due to measurement of the respective signals with the prober 122. The charging on an electrical device can also be measured with the electron beam device, wherein secondary or backscattered particles released or emitted from the area to be tested are measured with that detector. Thereby, the potential of the respective element to be tested can be determined and, for example, compared to an expected potential. Yet further, it is possible that a potential is provided to the respective electronic devices by providing a signal to the prober 122 and the respective potential is then measured with the electron beam device, as described above.

Typically in order to test the individual elements, i.e. electrical devices, on the flexible substrate, the electron beam can be scanned over the substrate and thereby provide the test area of the test device. Accordingly, according to some embodiments, which can be combined with other embodiments described herein, the test device is configured for testing a test area on the flexible substrate with the spatial resolution. Thereby, test results of different electrical devices on different locations on the substrates can be provided as spatially resolved test result, which indicates a malfunctioning electrical device. Thus, the result can be assigned to the specific electrical device. Accordingly, the specific electrical device may be repaired in a further processing step after testing.

Thus, according to some embodiments, a non-contact voltage image can be provided to provide a voltage map of the test area and, e.g. a display located therein. The voltage map can be processed through image analysis software and converted into complete pixel defect data. Thereby, a plurality of electrical devices, which can for example be provided in an array, can be checked and the test device can determine whether individual pixels or lines of pixels are functional. With the test devices described herein it may also be possible to find more subtle defects such as variations in individual voltages of the electrical devices, e.g. individual pixel voltages.

According to an alternative or additional test method or test device a beam source can be provided in the form of a lamp and can, for example, include a beam shaping optic. Parallel light beams are guided via a beam divider in the direction of the surface of the flexible substrate and a testing area thereof. The beam is reflected within the measurement head. Additionally, there is a modulator within the measurement head, which is e.g. capacitively coupled with the display to be tested. The modulator varies its local optical characteristics (birefringence and/or transmission) depending on the capacitive coupling to the individual pixels of the display. The light beam, which propagates along the optical axis, is influenced by the varied optical characteristics. The local variations of the light beam corresponding to an individual electrical device, e.g. a pixel, are measured by having the light beam, which is reflected at the measurement head, passing through the beam divider and being imaged on the detection camera with the optical system.

Thereby, a potential can also be measured with spatial resolution in order to detect functioning, i.e. electrical functioning, of electrical devices on the substrate. Thus, according to some embodiments, a non-contact voltage image can be provided to provide a voltage map of the test area and, e.g. a display located therein. The voltage map can be processed through image analysis software and converted into complete pixel defect data. Thereby, a plurality of electrical devices, which can for example be provided in an array, can be checked and the test device can determine whether individual pixels or lines of pixels are functional. With the test devices described herein it may also be possible to find more subtle defects such as variations in individual voltages of the electrical devices, e.g. individual pixel voltages.

It should be considered that the measuring of the potentials as sometimes referred to herein, can also be conducted by measuring the voltage differences of an electrical device as compared to a neighboring region or the like, or by measuring a voltage map of the flexible substrate or an area thereof. Typically, functional testing as described herein, and which can be combined with other embodiments described herein, refers to a voltage difference measurement, e.g. with spatial resolution.

According to embodiments described herein, a testing of electronics on flexible substrates, in particular displays, manufactured in a roll to roll process can be provided. Typically, the electronic devices can be arranged in an array on the flexible substrate and can, for example, be an array of transistors. The testing can be conducted in a roll-to-roll process. According to typical embodiments, the testing can be configured for providing a voltage map, i.e. an image of voltage contrast. This can be done by electron beam testing, by light testing with an optical modulator and/or means for birefringence, and/or with means for measuring electrical fields.

Figure 2:
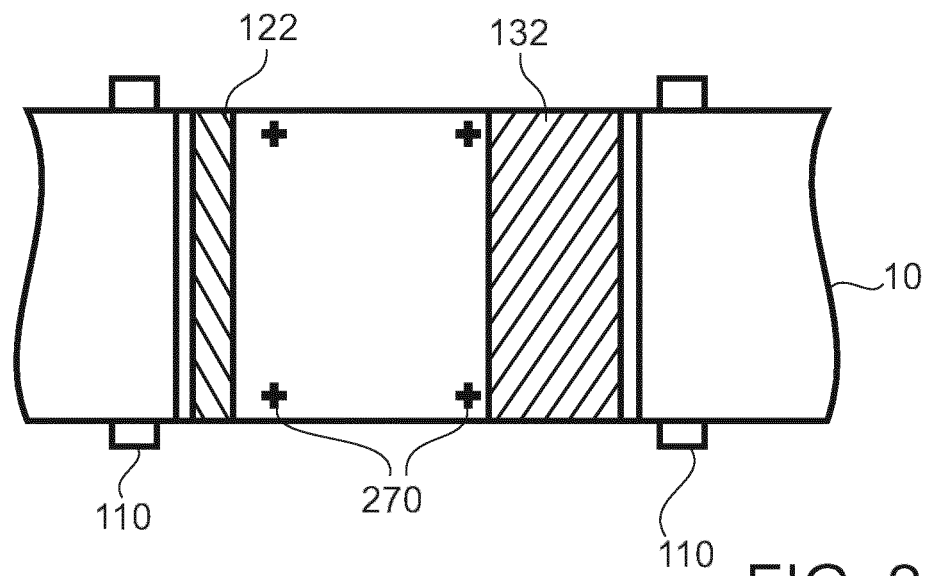
FIG. 2 shows another view of a test apparatus, for example the test apparatus shown in FIG. 1, the test apparatus being for testing of electronic devices on a flexible substrate according to embodiments described herein.

FIG. 2 shows another view of a test apparatus according to embodiments described herein. For example, the view shown in FIG. 2 can be considered a bottom view of the test apparatus 100 shown in FIG. 1. However, for embodiments where the test device tests the upper side (as compared to FIG. 1) of the flexible substrate 19, the view shown in FIG. 2 can also be considered a top view. Yet further, if the flexible substrate would be guided with the substrate width being vertically oriented, the view of FIG. 2 can also be considered as a side view. The testing apparatus includes at least two rollers 110 for guiding the flexible substrate 10 into a testing area along a transport direction. For the testing of electronic devices on the substrate, an electrical contact with the electronic devices is provided. Thereby, a prober 122, such as a probe head, is electrically connected with connections on the flexible substrate 10. According to typical embodiments, which can be combined with other embodiments described herein, the product that has been manufactured on the flexible substrate 10, such as a display, a solar cell, capacitors, or other products, includes contact pads for being contacted by the prober 122. The contact pads are electrically connected to the electronic elements of the product to be tested.

Further, a test device 132 is provided in the test area 112. That test device 132 is configured for functional testing of one or more of the electronic devices on the flexible substrate 10. Thereby, for example, if a display on the flexible substrate is tested, each thin-film transistor or for each pixel of the display can be tested by the test device 132. Typically, the test device conducts a test utilizing the prober 122. For example, the test device tests a voltage or potential provided on each pixel electrode and thereby tests the function of the electronic devices within the display, or the like.

According to some embodiments, which can be combined with other embodiments described herein, marks 270 can be provided on the flexible substrate 10. The marks are typically geometrical features. For example, the marks can have the same type, size, and shape for all products to be processed such as rectangles, crosses, etc. As an example, the marks shown in FIG. 2 are provided as cross-shaped marks.

According to typical embodiments, a test apparatus for testing of one or more electronic devices on a flexible substrate includes a detection device for detecting the marks. For example, the detection device can be an optical detection device. The detection device can be operatively connected to a controller with an image processing capability. Thereby, the position of the flexible substrate can be determined. From the position of the substrate, the position of the contact pads to be contacted and the position of the product on the flexible substrate and/or the electronic devices can be determined. Accordingly, the detection device can be configured to detect the marks. Thereby, the position of the electronic devices, which are tested by the testing device 132, can be determined. Accordingly, a defect detection of one or more electronic devices can be assigned to a specific electronic device. This allows, for example, for repair of the electronic device in a process conducted after the testing.

Figure 3:
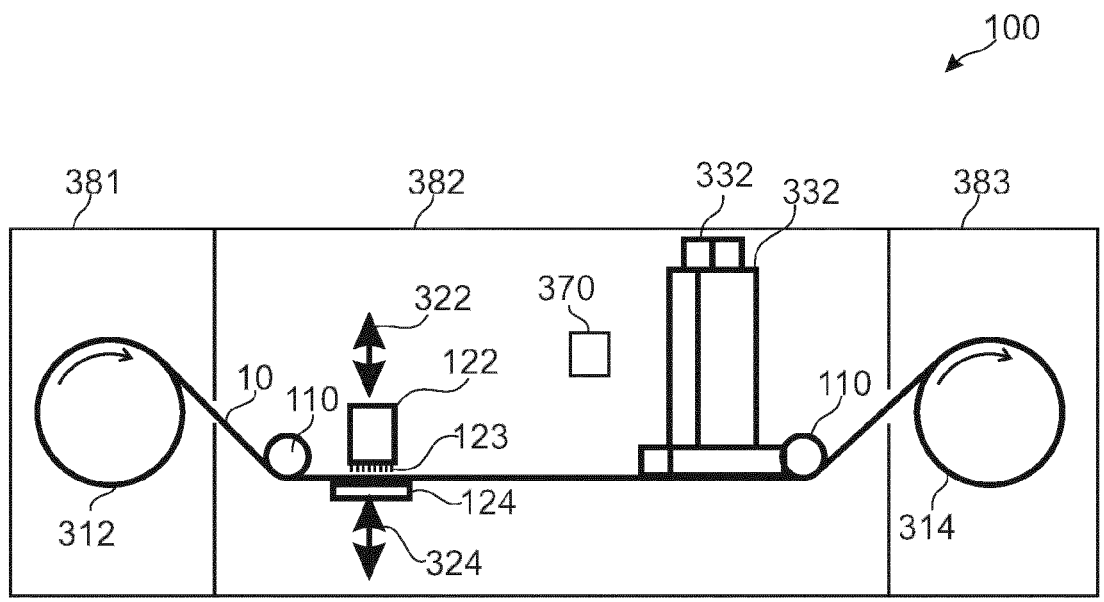
FIG. 3 shows a further test apparatus for testing of electronic devices on a flexible substrate according to embodiments described herein and having an electron beam test device.
Figure 4:
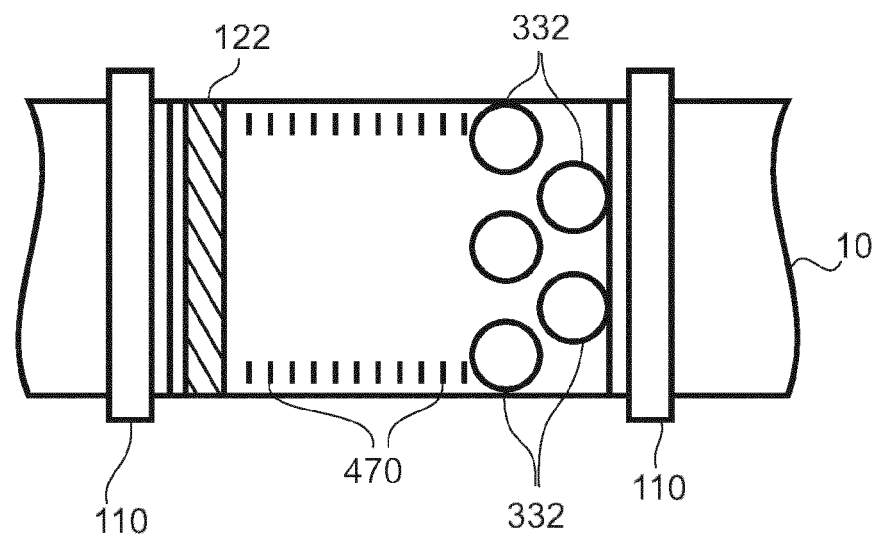
FIG. 4 shows another view of a test apparatus, for example the further test apparatus shown in FIG. 3, the test apparatus being for the testing of electronic devices on a flexible substrate according to embodiments described herein and having an electron beam test device.

According to additional or alternative implementations, which can be combined with other embodiments described herein, the marks can also be provided as periodic features, e.g. lines (see, e.g., FIG. 4). Such lines can, for example, be used with encoders. Accordingly, it is also possible that the detection device includes an encoder. Thereby, the detection device 370, which is exemplarily shown in FIG. 3, can include an encoder. Encoders can be particularly useful when the flexible substrate moves quickly and/or when the substrate movement is a continuous process.

The test apparatus 100, which is shown in FIG. 3, includes the first roll 312 for unwinding of the flexible substrate and the second roll 314 for winding the flexible substrate onto the roll after the testing of the electronic devices on the flexible substrate. According to typical embodiments, which can be combined with other embodiments described herein, the rolls 312 and 314 for the unwinding and winding of the flexible substrate can be provided in separate chambers 381 and 383.

According to some embodiments, which can be combined with other embodiments described herein, the chambers 381, 382 and 383 can be vacuum chambers. Thereby, a technical vacuum can be generated in the chambers. In the event that the testing of the electronic devices is conducted under vacuum, the separation of the unwinding and winding chambers 381 and 383 from the testing chamber 382 can be used to exchange the flexible substrate on the rolls 312 and 314, while the vacuum in the testing chamber 382 is maintained. Accordingly, the time for pumping the testing chamber 382 can be reduced and thereby a test apparatus 100 can provide an increased throughput.

According to yet further embodiments, which can be combined with other embodiments described herein, the vacuum chambers 381 and 382 as well as the vacuum chambers 382 and 383 can be separated by a valve unit. Typically, the valve units allow for individual venting of the chambers. Thereby, in light of the flexible substrate being thin, the valve unit can be adapted to seal the chambers from each other while a flexible substrate is provided within the valve unit.

The flexible substrate 10 is provided from the roll 312 out of the chamber 381 and into the chamber 382. Thereby, according to typical embodiments, which can be combined with other embodiments described herein, the roll 312 can be provided on a roll support means in the test apparatus 100. The flexible substrate is guided in testing chamber 382 by roller 110 into the testing area. In the testing area the prober 122 and the probing support 124 are provided. Typically, the prober 122 can include the contact assembly or contact pins 123 for contacting contact pads on the flexible substrate. The contact pads are in turn connected to the electronic devices to be tested.

As shown in FIG. 3 and FIG. 4, the test device can be provided by electron beam test columns 332. According to different embodiments, for example one, two or more charged particle beam test columns can be provided. FIG. 4 exemplarily shows five test columns, which are arranged to provide overlapping test areas. However, the columns can also be arranged in one line next to each other. When the electronic devices to be tested on the flexible substrate are moved in the testing area, the position of the flexible substrates and, thus, of the electronic devices can be detected by detection device 370. For example, as shown in FIG. 4, the detection device 370 can be configured to detect lines 470. Thereby, the detection device can include an encoder. The electronic devices on the flexible substrate are detected, for example, by charged particle beam column 332, wherein an electron beam or an ion beam is scanned across the area of the flexible substrate 10. Thereby, according to typical embodiments, which can be combined with other embodiments described herein, the area over which one charged particle beam is scanned is at least 10 cm×10 cm. Typically, even larger areas over which the charged particle beam is scanned can be provided, for example, the area can be 20 to 40 cm.

As described above, the testing of flexible substrates, which are provided roll-to-roll can be provided by appropriate probing assemblies, e.g. with a prober and a probing support, and testing devices for testing electronic devices and/or their functioning with testing devices such as charged particle beam columns, optical devices and or electrical circuits, which are capable of measuring a voltage map of an area of a flexible substrate to be tested. Thereby, it has to be considered that existing testers cannot be used for roll to roll testing since glass plates are handled, loaded, and unloaded individually by cassette loading stations, placed on a flat stage in the test system by a loading robot, positioned before testing by detecting alignment marks, and contacted by a prober that pushes the glass down to the stage. Existing glass test systems could only be used, for example, if the individual electronics devices would be cut out from the roll before testing. Embodiments of present invention allows for testing on flexible substrates, whereas comparable testing techniques can be utilized for glass testing. However, new concepts for handling, loading, positioning, and contacting, as well as new concepts of measuring different areas on the flexible substrate for a roll to roll test process are described. The examples described herein mainly refer to testing of displays and the pixel elements, e.g., TFTs provided therein. Embodiments described herein can, however, also be applied for other electronics devices such as solar cells or other electronics conventionally processed on wafers.

Figure 5A:
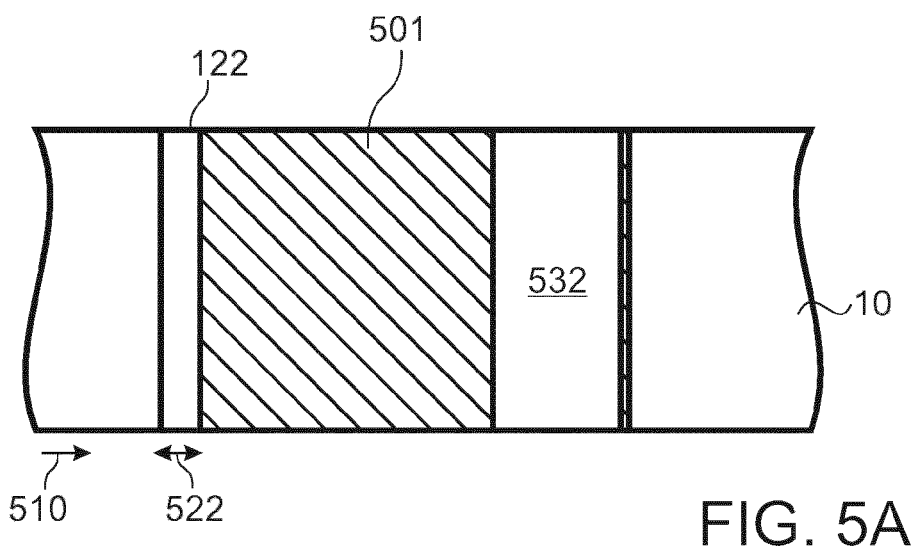
FIGS. 5A to 5C illustrates the testing of electronic devices on a flexible substrate according to embodiments described herein, and with an apparatus for testing of a plurality of electronic devices on a flexible substrate according to embodiments described herein.

According to different embodiments, the test apparatuses and test methods according to embodiments described herein can typically be conducted with the flexible substrate 10 being continuously moving or with flexible substrate 10 being stopped for conducting the test procedure as such. The different embodiments of testing and contacting of the electronic devices on the flexible substrate 10 are described with respect to FIGS. 5A to 5C and FIGS. 6A to 6B. FIG. 5A shows the flexible substrate 10, which moves along a transport direction 510. The prober 122 can be moved as indicated by arrow 522. An area 501 to be tested, for example, a display on the flexible substrate 10, is provided on the flexible substrate and the testing area of 532 is provided by the testing device.

Figure 5B:
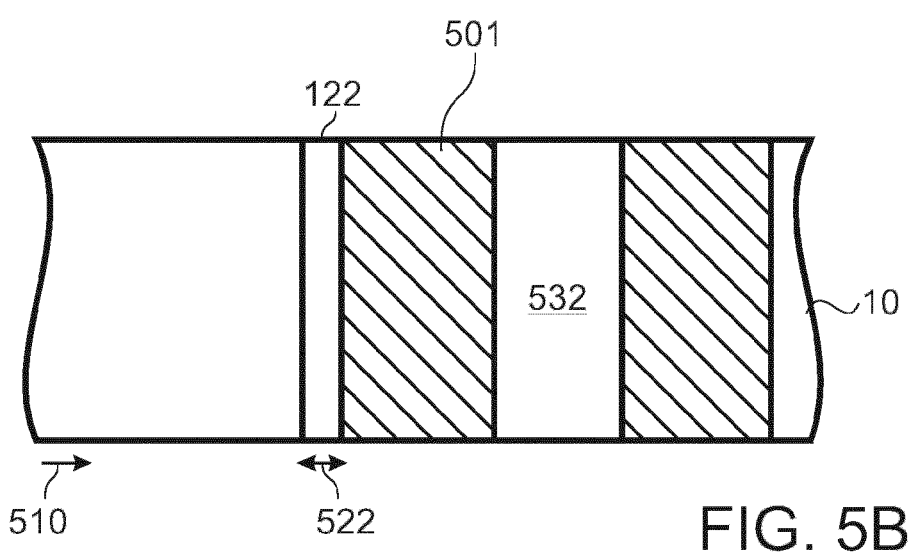

According to different embodiments, the testing area 532 can be provided by one or more charged particle beam testing devices, optical testing devices or electronic circuits testing the electric fields within the test area 501. For example, the area 501 to be tested can include a display with a plurality, i.e. thousands or millions, of thin-film transistors, wherein each thin-film transistor (electronic device) is tested within the test area 532 by the test device. The area 501 to be tested is shown in the first position in FIG. 5A. In FIG. 5B, the flexible substrate 10 has been moved along the transport direction 510 and the further portion of the area 501 to be tested can be tested within the test area 532. As shown in FIG. 5B, the prober 122 moves simultaneous with the flexible substrate 10. Thereby, the prober 122 can stay in contact with the contact pads on the flexible substrate 10 while the flexible substrate 10 is moving.

According to some embodiments, which can be combined with other embodiments described herein, the flexible substrate 10 can move, after the first portion of the area 501 to be tested has been tested by the test area 532, such that an adjacent portion of the area 501 to be tested is provided below the test area 532. Thereby, particularly for a test process wherein the substrate is stopped for testing, typically an overlap can be provided from one test area to the subsequent test area. As described above, a detection device for detection marks or encoder signals on the substrate can be used to determine the actual position of the substrate.

Figure 5C:
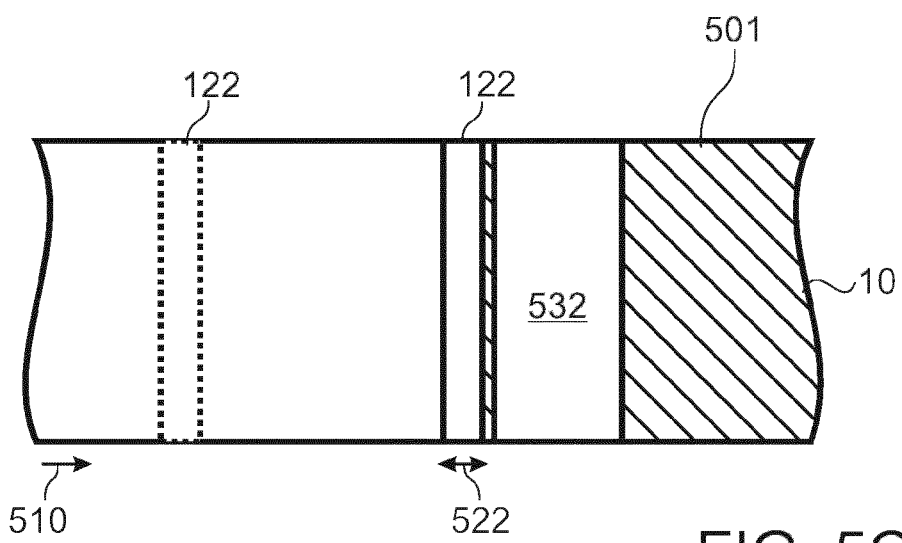

According to some embodiments, testing of subsequent areas can be done by moving the substrate in transport direction and stopping the substrate in order to conduct the test of the portion provided below the test area 532. According to other embodiments, which can be combined with other embodiments described herein, the substrate 10 can be continuously moved along transport direction 510 and portions of the area 501 to be tested are continuously tested while the substrate moves with respect to the test area 532. FIG. 5C shows a scenario where the flexible substrate 10 has been moved even further in transport direction 510 and the last portion of the area 501 to be tested is provided below the test area 532. As shown in FIG. 5C, the prober 122 follows the movement of the flexible substrate 10, and, for example, remains in contact until the last portion of the area 501 to be tested has been tested by the testing device providing the test area 532. FIG. 5C shows a yet further prober 122 (see dotted lines), which can be provided according to some embodiments, and which can be combined with other embodiments described herein. The second prober 122 (dotted lines) can be provided to have electrical contact with a yet further area to be tested and can, thereafter, be moved with the further area 501 to be tested. In the meantime, while the second prober 122 moves with the further test area, the first proper 122 can be moved back as indicated by arrows 522 to contact the area to be tested following the further area to be tested. Thereby, for example, two probers and two probing supports can be provided. One prober assembly moves with an area to be tested, e.g. a display, while the other prober assembly waits for the next display to be contacted. Thereby, a continuous flow can be provided.

Figure 6A:
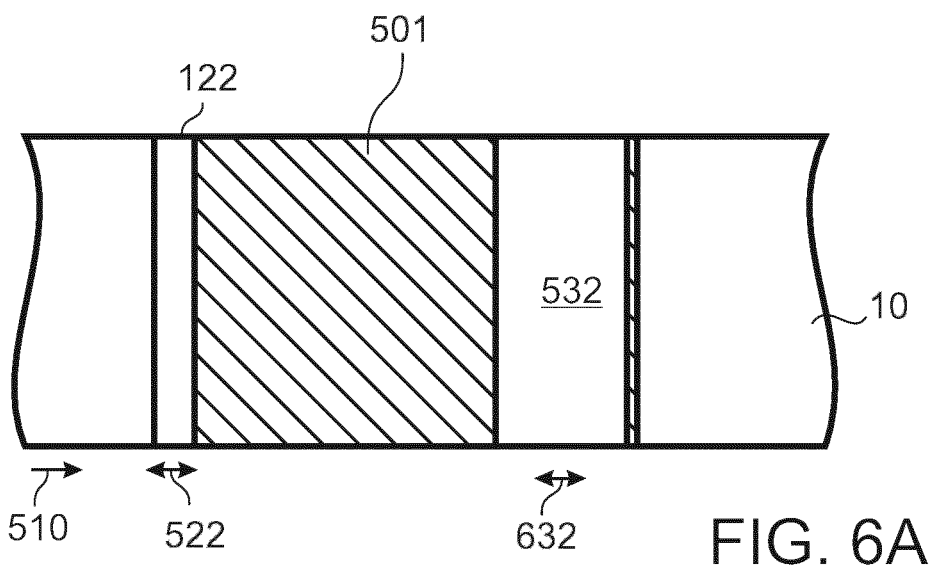
FIGS. 6A to 6B illustrates testing of electronic devices on a flexible substrate according to further embodiments described herein, and with an apparatus for the testing of a plurality of electronic devices on a flexible substrate according to embodiments described herein.

FIG. 6A illustrates yet further embodiments, which can be combined with other embodiments described herein. The flexible substrate 10 is moved along transport direction 510, for example from one roll to another roll and guided by guiding rollers. The prober 122 can be moved as indicated by arrow 522 in a direction parallel to the transport direction 510, wherein an area 501 to be tested can be provided below the test area 532 of the testing device configured to test an area on the flexible substrate 10. As further indicated by arrow 632, the testing device can be moved such that the test area 532 moves in the direction parallel to the transport direction 510.

Figure 6B:
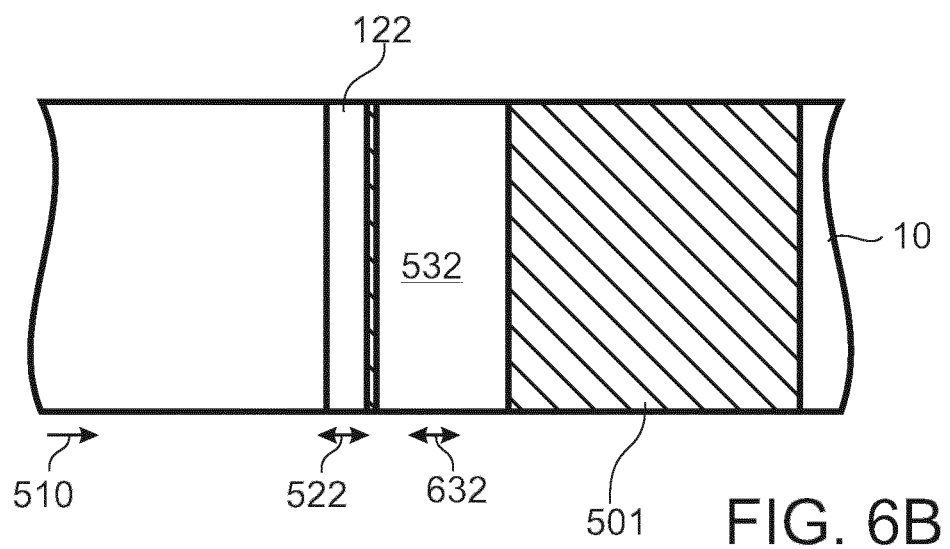

Thereby, for example the area 501 to be tested can maintain stationary, while the testing device moves across the area 501 to be tested. According to further alternatives, as shown in FIG. 6B, the flexible substrate, and the testing device can be moved. As described above, typically the prober 122 moves in a synchronized manner with the flexible substrate 10 as long as the prober is in contact with the area 501 to be tested and the respective electronic devices provided with respect thereto.

According to yet further embodiments, which can be combined with other embodiments described herein, in the case of a non-moving substrate the prober can be at a fixed position and the test area 532 can measure the area 501 to be tested by movement of the test device.

In light of the above, the typical method of testing a plurality of electronic devices on the flexible substrate includes guiding the flexible substrate from one roll to another roll in the testing device or in a substrate processing system. This is, for example, indicated by step 802 shown in FIG. 8. A plurality of electronic devices and/or an area to be tested on the flexible substrate is probed by a prober, wherein electrical contact is provided for sending and/or receiving signals from the electronic devices via the prober. This is indicated by step 804 shown in FIG. 8. The electronic devices, which are electrically contacted by a prober, can be tested in step 806.

In light of the above, a plurality of embodiments are described herein. According to one embodiment, an apparatus for the functional testing of electronic devices on a flexible substrate is provided. The apparatus includes two rolls, on one of which the substrate is located initially and another one to which the substrate is transported during the test process, at least one probing device or prober in an area between the two rolls that contacts the devices on the substrate and at least one test device or sensing device between the two rolls that allows detection of voltages of components within the electronic device. According to typical implementations thereof, one or more of the following characteristics or features can be provided: the electronic devices can be a transistor array for use in a display or the electronic device is a solar cell in the final or intermediate process stage; the sensing device, i.e. the testing device, can be a light optical system that uses birefringence to modulate the light based on the voltage of the components, the sensing device can be an electron beam system with a detector that uses detection of emitted electrons to detect the voltage of the components, and/or the sensing device can be an electronic circuit that detects the electric field of the components by electrical coupling to components of the circuit; the probing device is combined with a support device that supports the substrate from the other side, opposite to the probing device, at least in the area where the probing device makes contact and during the time the probing device makes contact; and the support device moves away from the substrate when the probing device disconnects the contact. According to yet further embodiments, which can be combined with other embodiments described herein, the probing support can be a roller such that a movement of the flexible substrate can be conducted without moving the probing support away from the substrate. According to yet further embodiments, which can be combined with other embodiments described herein, the probing support can be the roller for guiding the substrate in the test area. According to yet further implementations, which can also be combined with other embodiments described herein, one or more of the following characteristics or features can be provided: the sensing device is configured to test one area that spans over the whole width of the flexible substrate and the flexible substrate advances on its transport from one roll to the other roll during the test, the width being perpendicular to the direction of transport; the sensing device is configured to test an area that spans over the whole width in that the sensing device is moving over the whole width; the sensing device is configured to test an area that spans over the whole width in that the sensing device has a size covering the whole width; the apparatus can include guiding devices, e.g. rollers, that bring the flexible substrate into a pre-defined plane in the testing area independently from the number of turns of substrate material that is present on any of the two rolls, for example the rollers (guiding devices) can include air bearings or hover cushions; the apparatus can include an optical device for detection of alignment marks and the flexible substrate and/or the electronic devices can have alignment marks that are detected with a detection device to locate the position of the flexible substrate and the electronic devices relative to the probing and sensing devices. For example, the marks can be geometrical features of the same type, size, and shape for all products to be processed such as rectangles, crosses, etc. and/or the marks can be periodic features as used in encoders.

According to some embodiments, which can be combined with other embodiments described herein, the flexible substrate can advance in steps and stops each time for the test of one test area or the testing can be done on the fly while the substrate is moving, i.e. continuously moving. Thereby, the probing device can move with the substrate and stays in contact with the electronic device during the test of the devices and moves to a subsequent group of electronic devices after one group of devices has been tested. Thereby, according to some embodiment, which can be combined with other embodiments described herein, the prober is configured to contact the flexible substrate, for example also when the flexible substrate is moving, without scratching a surface of the flexible substrate.

FIG. 9 illustrates steps of a process of probing the flexible substrate 10 with a prober assembly having a prober 122 and a probing support 124. The flexible substrate 10 has n one alignment mark 270 in order to illustrate the movement of the flexible substrate in FIG. 9. It is to be understood that typically a plurality of alignment marks 270 can be provided. The substrate moves along the transport direction 210. Initially, the prober assembly is not in contact with the substrate 10 and starts at a starting position with its movement. Accordingly, the prober assembly cannot scratch or otherwise deteriorate one of the surfaces of the flexible substrate. This is particularly important for the substrate side, which has been previously processed and on which, for example, layers and/or electrical devices have been deposited.

The prober assembly 122+124 starts moving with the flexible substrate 10 as indicated by arrow 522 such that the movement 510 and the movement 522 are synchronized, i.e. there is no relative movement of the substrate and the prober assembly in a direction relative to the transport direction 510. Then, the prober assembly moves to contact the electronic devices or the contact pads, respectively, on the flexible substrate as indicated by arrows 922. Thereby, typically the prober 122 and the probing support 124 are moved with a velocity component perpendicular to the surface of the substrate. That is, the movement 522 and the movements 922 can be superimposed. During testing the prober assembly maintains in electrical contact. Thereafter, the prober assembly disconnects from the contacts provided on the flexible substrate 10 as indicated by arrows 924. Thereby, typically, the prober 122 and the probing support 124 move with a velocity component perpendicular to the surface of the substrate. This allows for the flexible substrate to continue the movement along the transport direction 510 without being in mechanical contact with both, the prober 122 and the probing support 124. Accordingly, testing of flexible substrates can be conducted without damaging a surface of the flexible substrate.

As shown in FIG. 9, according to some embodiments, which can be combined with other embodiments described herein, it is possible that a further prober assembly having prober 122' and probing support 124' contacts the flexible substrate 10 while the prober assembly 122+124 is still at a position downstream with respect to the transport direction 510 of the flexible substrate 10. While the further prober assembly 122'+124' makes contact for testing a further area of the substrate, the prober assembly 122+124 moves back in the starting position as indicated by arrow 936.

Figure 7:
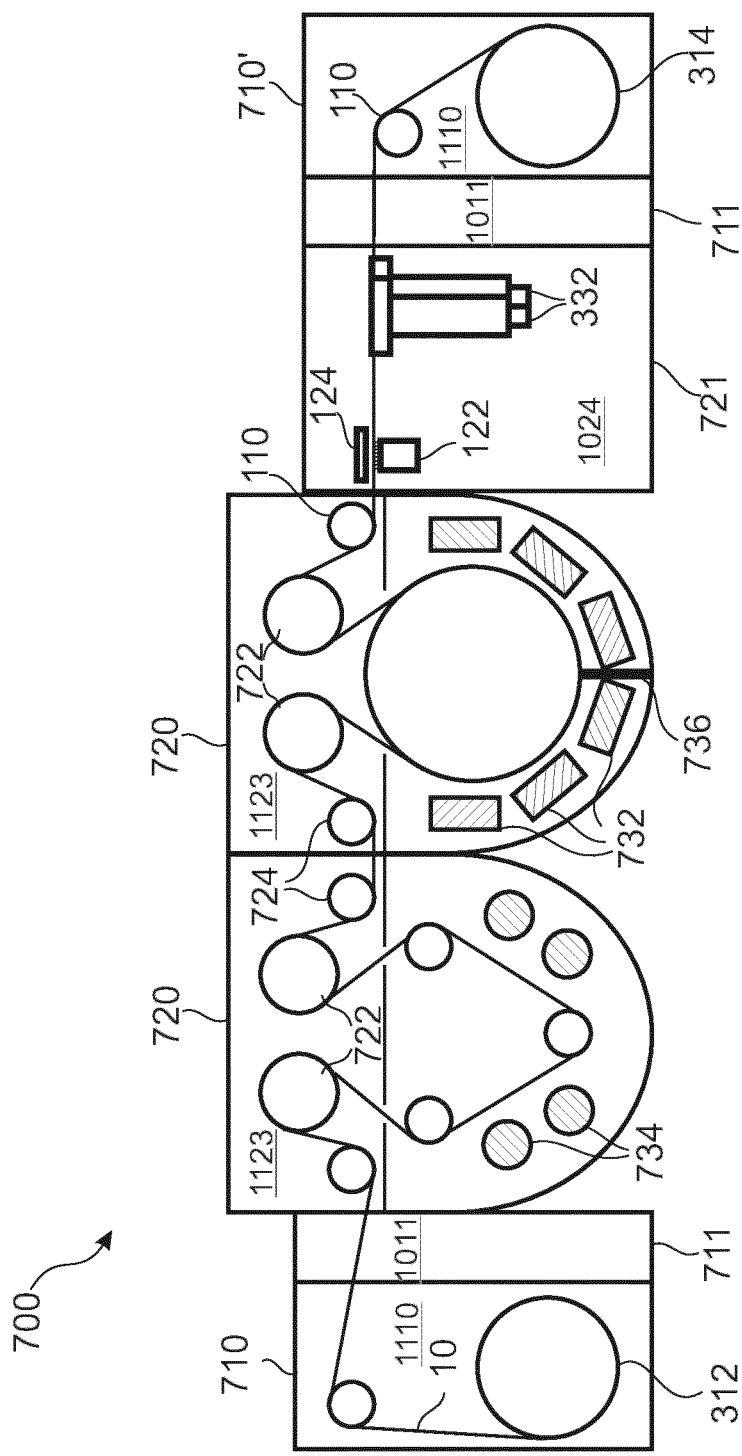
FIG. 7 shows a further test apparatus for testing of electronic devices on a flexible substrates according to embodiments described herein and further shows a processing system for processing of the flexible substrate to be tested with the test apparatus.

A thin film deposition system 700 is shown in FIG. 7. The thin film deposition system 700 includes an unwinding station 710, a winding station 710', a first processing chamber and a second processing chamber. The first processing chamber and the second processing chamber include a plurality of guiding rollers 722 and 724 for guiding the flexible substrate 10. Further, the first processing chamber and the second processing chamber include deposition sources 732 and 734, wherein the deposition sources 732 deposit the flexible substrate while being provided on a processing drum 726. Additionally, a load lock chamber 711 is provided between the unwinding station 110 and the first chamber 720. A further load lock chamber 711 is provided between the chamber 720 and the winding station 710'. The load lock chambers each include seals, which can be closed for example while the flexible substrate is fed through the thin film deposition system or without the presence of the substrate. Thereby, the winding station and the unwinding station can be open and have atmospheric pressure while the remaining system is evacuated. Further, the load lock chambers can be used to provide an intermediate vacuum stage such that the pressure difference between the winding station and the processing chamber can be increased.

As shown for example in FIG. 7, the chambers and stations can separate the deposition system in different regions. According to some embodiments, these regions can similarly be provided in any of the other embodiments described herein. Thereby, separation means adapted for separating the regions can be provided based on the concept of a common platform in different regions. According to some embodiments, a gas separation 736 can be provided. Further, each of the chambers 720 may include further areas, wherein for example, the deposition region is separated from the region, in which the guiding rollers 722 and 724 are provided. Thereby, different processing atmospheres, e.g., different processing pressures can be provided in different regions in the thin film deposition system.

For example, the system shows regions 1110 in the winding and unwinding station, regions 1011 in the load lock chambers 1010, regions 1024 in the testing chamber 721, gas cushion regions or web guiding regions 1123 in the processing chambers 720, and processing regions in the processing chambers. One or more of these regions each can have different atmospheres, e.g., pressures. For example, the gas insertion due to the gas cushion regions can be separated to reduce the influence on other regions by gas separation means.

According to different embodiments, which can be combined with other embodiments described herein, the regions for enclosing the gas cushion rollers, e.g. rollers 724, can have a pressure of 1 mbar to about $1 \cdot 10^{-2}$ mbar, whereas during operation the other regions my be evacuated during operation to a pressure of $1 \cdot 10^{-2}$ mbar to $1 \cdot 10^4$ mbar.

According to some embodiments, which can be combined with other embodiments described herein, the processing chambers 720 are designed such as to allow a deposition of layers and respective electronic devices on the flexible substrate. Deposition can be conducted by a PVD process, a sputtering process, especially a reactive sputtering process, an evaporation process, a CVD process, a PECVD process, or a low pressure chemical vapor deposition (LPCVD) process, so that the processing chambers 720 can be further equipped with a different deposition sources.

After the depositing of layers and/or structuring of layers in the processing chambers 720, the substrate 10 is moved to the chamber 721 wherein testing, i.e. functional testing, of electronic devices on the flexible substrate can be conducted. Thereby, prober 122 and a probing support 124 are provided in a test device, e.g. charged particle beam columns 332, are provided for generating, together with the prober assembly and the signals provided and/or received therefrom, a voltage map of the substrate. The voltage map can be used to detect defects on the substrate, for example, can identify malfunctioning electronic devices on the substrate. According to yet further embodiments, a repair chamber (not shown in FIG. 7) can also be provided such that malfunctioning electronic devices can be repaired before the flexible substrate is wound up on the roll 314. Alternatively, as the electronic devices can be identified due to the alignment marks, a repair can also be conducted outside of the system 700.

According to embodiments described herein, for test systems and test methods which are provided in an in-line system with the manufacturing of the product on the flexible substrate, testing can be conducted according to the substrate movement during manufacturing, for example a continuous and fast movement of the substrate from roll-to-roll. In order to be able to detect and repair defects of the electronic devices, for example wrong connections, opens, or other electrical malfunctioning occurrences, the functional testing of the electrical devices, for example in an array of electrical devices, should be conducted similarly as the manufacturing in a roll-to-roll process. Thereby, the full benefit of the reduced manufacturing costs of electronic products on flexible substrates can be utilized.

Further, according to embodiments described herein, testing is in general possible on a roll-to-roll system, irrespective of whether processing is included in the same roll-to-roll system or not. By being able to provide functional testing of electronic devices on a flexible substrate, e.g. transistors of a display on a flexible substrate, in a roll-to-roll process, the improvements of costs of ownership for using flexible substrate can be further continued for testing applications.

While the foregoing is directed to embodiments of the invention, other and further embodiments of the invention may be devised without departing from the basic scope thereof, and the scope thereof is determined by the claims that follow.

The invention claimed is:

1. An apparatus for testing of a plurality of electronic devices on a flexible substrate, comprising:
   at least one roller configured for guiding the flexible substrate in a testing area along a transport direction;
   at least one prober configured for electrically contacting one or more of the electronic devices;
   at least one probing support configured for supporting a portion of flexible substrate during electrically contacting with the at least one prober; and
   a test device for functional testing of one or more of the electronic devices, wherein the at least one prober is configured to stay in contact with contact pads on the flexible substrate while the flexible substrate is moving, wherein the contact pads are connected to the electronic devices to be tested, and wherein the at least one probing support is configured to move synchronized with the at least one prober.

2. The apparatus according to claim 1, wherein the test device comprises a light optical system with an optical modulator.

3. The apparatus according to claim 2, wherein the light optical system uses birefringence to modulate light based on the potential of the one or more electronic devices.

4. The apparatus according to claim 1, wherein the test device comprises a charged particle beam test system, wherein the charged particle beam test system comprises a detector for detecting secondary and/or backscattered charged particles to detect the potential of the one or more electronic devices.

5. The apparatus according to claim 4, wherein the test device comprises an electron beam test system.

6. The apparatus according to claim 1, wherein the test device comprises an electrical circuit configured for detecting the electrical field of the one or more electronic devices.

7. The apparatus according to claim 1, wherein the at least one prober is provided on one side of the flexible substrate and the at least one probing support is provided on the opposing side of the flexible substrate and opposing the at least one prober.

8. The apparatus according to claim 1, wherein the at least one prober and the at least one probing support are configured for moving relative to each other in a direction perpendicular to a substrate plane of the flexible substrate, wherein the at least one prober and the at least one probing support are configured for having a first relative position such that the flexible substrate is movable between the at least one prober and the at least one probing support and for having a second relative position such that the flexible substrate is electrically contacted while being supported by the at least one probing super.

9. The apparatus according to claim 1, wherein the at least one prober and/or the at least one probing support moves away from the flexible substrate for disconnecting of the at least one probing support.

10. The apparatus according to claim 1, wherein the test device provides a testing over essentially the entire width of the flexible substrate by one or more of the following configurations:
the test device has a testing area that spans over essentially the entire width of the flexible substrate;
the test device has a testing area and is configured for moving the testing area over essentially the entire width of the flexible substrate;
the test device has a plurality of testing areas that are distributed to cover essentially the entire width of the flexible substrate;
the flexible substrate is moved in the transport direction relative to the test device; and
the test device is moved relative to the flexible substrate in a direction parallel to the transport direction of the flexible substrate.

11. The apparatus according to claim 1, wherein the at least one prober and the at least one probing support are configured to move in directions parallel to the transport direction.

12. The apparatus according to claim 1, further comprising;
a detection device configured for detecting alignment marks on the flexible substrate.

13. The apparatus according to claim 1, wherein the at least one roller is at least two rollers configured for guiding the flexible substrate into the testing area and out of the testing area.

14. The apparatus according to claim 1, wherein the test device comprises an electrical circuit configured for detecting the electrical field of the one or more electronic devices by electrical coupling to components of the electrical circuit.

15. The apparatus according to claim 1, wherein the at least one prober and the at least one probing support are configured to move in directions parallel to the transport direction while maintaining electrical contact, to the one or more electronic devices.

16. The apparatus according to claim 1, further comprising:
a detection device configured for detecting alignment marks on the flexible substrate for detecting the position of the flexible substrate in the transport direction an/or the position of the electronic devices relative to the at least one prober and the testing device.

17. A method of testing of a plurality of electronic devices on a flexible substrate, comprising:
guiding the flexible substrate from on roll into a testing area and the testing area onto a further roll along a transport direction;
supporting a first side of the flexible substrate with at least one probing support;
probing one or more of the electronic devices from a second side of the flexible substrate with at least one prober, wherein the second side opposes the first side; and
testing the electrical functioning of the one or more of the electronic devices, wherein the guiding comprises moving the substrate, wherein probing and testing is conducted while the substrate is moved, and wherein probing and testing comprises moving the at least one probing support and the at least one prober in a synchronized manner with the substrate.

18. The method according to claim 17, wherein the guiding comprises moving the substrate and stopping the movement of the substrate, and wherein probing and testing is conducted while the movement of the substrate is stopped.

* * * * *